(12) United States Patent
Ni et al.

(10) Patent No.: US 6,852,641 B2
(45) Date of Patent: Feb. 8, 2005

(54) METHOD OF SPIKING MIXED ACID LIQUID IN REACTOR

(75) Inventors: Chih-Jung Ni, Hsinchu (TW); Jia-Shing Jan, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 315 days.

(21) Appl. No.: 10/063,975

(22) Filed: May 30, 2002

(65) Prior Publication Data

US 2003/0143860 A1 Jul. 31, 2003

(30) Foreign Application Priority Data

Jan. 28, 2002 (TW) ........................................ 91101327 A

(51) Int. Cl.$^7$ ............................................ H01L 21/302
(52) U.S. Cl. ........................ 438/745; 438/750; 438/751; 216/108
(58) Field of Search ................................ 438/745, 750, 438/751, 747; 216/83, 108, 109; 134/1.2, 1.3, 3

(56) References Cited

U.S. PATENT DOCUMENTS 5,810,940 A * 9/1998 Fukazawa et al. ............. 134/3
6,132,522 A * 10/2000 Verhaverbeke et al. ....... 134/26

* cited by examiner

Primary Examiner—Lan Vinh
(74) Attorney, Agent, or Firm—Jianq Chyun IP Office

(57) ABSTRACT

A method of spiking a mixed acid liquid in a reactor is performed under three modes of control, a based-on-charge mode control, a based-on-time mode control, and a based-on-time-and-charge mode control. In the based-on-charge mode control, spike timing and spiking amount of an acid liquid are set for each lot of product. In the based-on-time mode control, the spike timing and the spiking amount of the acid liquid are set for each timing point. In the based-on-time-and-charge mode control, the spike timing and the spiking amount of an acid liquid are set for each lot of product and each timing point. Thereby, a concentration of the mixed acid liquid is controlled at a targetlevel.

4 Claims, 15 Drawing Sheets

| | settings | Description |
|---|---|---|
| HF spiking interval | 1 Lots | The interval of HF Spiking for each lot(Spike) |
| HF spike timing | 1(or2) | 1 : before spiking ; 2 : after HF spiking |
| Number of HF spiking | 4 Times | The stroke count of a measuring pump used for HF spiking |

|  | settings | Description |
| --- | --- | --- |
| HF spiking interval | 1 Lots | The interval of HF Spiking for each lot(Spike) |
| HF spike timing | 1(or2) | 1 : before spiking ; 2 : after HF spiking |
| Number of HF spiking | 4 Times | The stroke count of a measuring pump used for HF spiking |

Fig.1a

|  | settings | Description |
| --- | --- | --- |
| HF spiking interval | 5 Lots | HF Spiking for every 5 lots |
| HF spiking timing | 1(or2) | 1 : before spiking ; 2 : after HF spiking |
| Number of HF spiking | 3 Times | The stroke count of a measuring pump used for HF spiking |

Fig.1b

|  | Settings | Description |
|---|---|---|
| HF spiking interval | 60 Min | The interval of HF Spiking |
| Number of HF spiking | 4 Times | The stroke count of a measuring pump used for HF spiking |

Fig.3a

|  | Settings | Description |
|---|---|---|
| HF spiking interval | 60 Min | The interval of HF Spiking |
| Number of HF spiking | 3 Times | The stroke count of a measuring pump used for HF spiking |

Fig.3b

| Result of etching before system running (280 sec. of etching time) | | Target value : 140Å | | Target value 440 Å | |
| --- | --- | --- | --- | --- | --- |
| Group | Etching amount of silicon nitride monitor wafer | Etching time(sec) | recipe | Etching time(sec) | recipe |
| Group 1 | 110-120Å | 341 | 11 | 536 | 21 |
| Group 2 | 120-130Å | 314 | 12 | 493 | 22 |
| Group 3 | 130-140Å | 290 | 13 | 456 | 23 |
| Group 4 | 140-150Å | 270 | 14 | 425 | 24 |
| Group 5 | 150-160Å | 253 | 15 | 397 | 25 |
| Group 6 | 160-170Å | 238 | 16 | 373 | 26 |
| Group 7 | 170-180Å | 224 | 17 | 352 | 27 |

Fig.5a

| Result of etching before system running (X sec. of etching time) | | Target value : 140Å | | Target value : 440 Å | |
|---|---|---|---|---|---|
| Group | Etching rate of silicon nitride monitor wafer(Å/sec) | Etching time(sec) | recipe | Etching time(sec) | recipe |
| Group 1 | 0.393-0.429 | 341 | 11 | 536 | 21 |
| Group 2 | 0.429-0.464 | 314 | 12 | 493 | 22 |
| Group 3 | 0.464-0.500 | 290 | 13 | 456 | 23 |
| Group 4 | 0.500-0.536 | 270 | 14 | 425 | 24 |
| Group 5 | 0.536-0.571 | 253 | 15 | 397 | 25 |
| Group 6 | 0.571-0.607 | 238 | 16 | 373 | 26 |
| Group 7 | 0.607-0.643 | 224 | 17 | 352 | 27 |

Fig.5b

| Based-on-charge mode | | | Based-on-time mode | | | | | Selection of control mode |
|---|---|---|---|---|---|---|---|---|
| 1, ☐ | 21, ☐ | 41, ☐ | 1, ☐ | 21, ☐ | 41, ☐ | 61, ☐ | 81, ☐ | Even-charge mode |
| 2, ☐ | 22, ☐ | 42, ☐ | 2, ☐ | 22, ☐ | 42, ☐ | 62, ☐ | 82, ☐ | Based-on-charge mode |
| 3, ☐ | 23, ☐ | 43, ☐ | 3, ☐ | 23, ☐ | 43, ☐ | 63, ☐ | 83, ☐ | Based-on-time mode |
| 4, ☐ | 24, ☐ | 44, ☐ | 4, ☐ | 24, ☐ | 44, ☐ | 64, ☐ | 84, ☐ | Based-on-time-and-charge mode |
| 5, ☐ | 25, ☐ | 45, ☐ | 5, ☐ | 25, ☐ | 45, ☐ | 65, ☐ | 85, ☐ | |
| 6, ☐ | 26, ☐ | 46, ☐ | 6, ☐ | 26, ☐ | 46, ☐ | 66, ☐ | 86, ☐ | |
| 7, ☐ | 27, ☐ | 47, ☐ | 7, ☐ | 27, ☐ | 47, ☐ | 67, ☐ | 87, ☐ | |
| 8, ☐ | 28, ☐ | 48, ☐ | 8, ☐ | 28, ☐ | 48, ☐ | 68, ☐ | 88, ☐ | |
| 9, ☐ | 29, ☐ | 49, ☐ | 9, ☐ | 29, ☐ | 49, ☐ | 69, ☐ | 89, ☐ | |
| 10, ☐ | 30, ☐ | | 10, ☐ | 30, ☐ | 50, ☐ | 70, ☐ | 90, ☐ | |
| 11, ☐ | 31, ☐ | | 11, ☐ | 31, ☐ | 51, ☐ | 71, ☐ | 91, ☐ | |
| 12, ☐ | 32, ☐ | | 12, ☐ | 32, ☐ | 52, ☐ | 72, ☐ | 92, ☐ | |
| 13, ☐ | 33, ☐ | | 13, ☐ | 33, ☐ | 53, ☐ | 73, ☐ | 93, ☐ | |
| 14, ☐ | 34, ☐ | | 14, ☐ | 34, ☐ | 54, ☐ | 74, ☐ | 94, ☐ | |
| 15, ☐ | 35, ☐ | | 15, ☐ | 35, ☐ | 55, ☐ | 75, ☐ | 95, ☐ | |
| 16, ☐ | 36, ☐ | | 16, ☐ | 36, ☐ | 56, ☐ | 76, ☐ | 96, ☐ | |
| 17, ☐ | 37, ☐ | | 17, ☐ | 37, ☐ | 57, ☐ | 77, ☐ | 97, ☐ | |
| 18, ☐ | 38, ☐ | | 18, ☐ | 38, ☐ | 58, ☐ | 78, ☐ | 98, ☐ | |
| 19, ☐ | 39, ☐ | | 19, ☐ | 39, ☐ | 59, ☐ | 79, ☐ | 99, ☐ | |
| 20, ☐ | 40, ☐ | | 20, ☐ | 40, ☐ | 60, ☐ | 80, ☐ | | |

Fig.7

Based-on-charge mode

| | | |
|---|---|---|
| 1, 1 | 21, 1 | 41, 1 |
| 2, 2 | 22, 2 | 42, 2 |
| 3, 1 | 23, 1 | 43, 1 |
| 4, 2 | 24, 2 | 44, 2 |
| 5, 1 | 25, 1 | 45, 1 |
| 6, 2 | 26, 2 | 46, 2 |
| 7, 1 | 27, 1 | 47, 1 |
| 8, 2 | 28, 2 | 48, 2 |
| 9, 1 | 29, 1 | 49, 1 |
| 10, 2 | 30, 2 | |
| 11, 1 | 31, 1 | |
| 12, 2 | 32, 2 | |
| 13, 1 | 33, 1 | |
| 14, 2 | 34, 2 | |
| 15, 1 | 35, 1 | |
| 16, 2 | 36, 2 | |
| 17, 1 | 37, 1 | |
| 18, 2 | 38, 2 | |
| 19, 1 | 39, 1 | |
| 20, 2 | 40, 2 | |

Fig. 8a

| Based-on-charge mode | | |
|---|---|---|
| 1, 0 | 21, 0 | 41, 0 |
| 2, 0 | 22, 0 | 42, 0 |
| 3, 0 | 23, 0 | 43, 0 |
| 4, 0 | 24, 0 | 44, 0 |
| 5, 1 | 25, 1 | 45, 1 |
| 6, 0 | 26, 0 | 46, 0 |
| 7, 0 | 27, 0 | 47, 0 |
| 8, 0 | 28, 0 | 48, 0 |
| 9, 0 | 29, 0 | 49, 0 |
| 10, 1 | 30, 1 | |
| 11, 0 | 31, 0 | |
| 12, 0 | 32, 0 | |
| 13, 0 | 33, 0 | |
| 14, 0 | 34, 0 | |
| 15, 1 | 35, 1 | |
| 16, 0 | 36, 0 | |
| 17, 0 | 37, 0 | |
| 18, 0 | 38, 0 | |
| 19, 0 | 39, 0 | |
| 20, 1 | 40, 1 | |

Fig.8b

Based-on-time mode

| | | | | |
|---|---|---|---|---|
| 1, 30 | 21, 3 | 41, 3 | 61, 4 | 81, 4 |
| 2, 5 | 22, 4 | 42, 3 | 62, 4 | 82, 4 |
| 3, 3 | 23, 3 | 43, 3 | 63, 3 | 83, 3 |
| 4, 4 | 24, 4 | 44, 4 | 64, 4 | 84, 4 |
| 5, 4 | 25, 4 | 45, 3 | 65, 4 | 85, 4 |
| 6, 4 | 26, 4 | 46, 4 | 66, 4 | 86, 4 |
| 7, 3 | 27, 3 | 47, 3 | 67, 3 | 87, 3 |
| 8, 4 | 28, 4 | 48, 4 | 68, 4 | 88, 4 |
| 9, 4 | 29, 4 | 49, 3 | 69, 4 | 89, 4 |
| 10, 4 | 30, 3 | 50, 4 | 70, 4 | 90, 4 |
| 11, 3 | 31, 3 | 51, 3 | 71, 3 | 91, 3 |
| 12, 4 | 32, 3 | 52, 4 | 72, 4 | 92, 4 |
| 13, 4 | 33, 3 | 53, 3 | 73, 4 | 93, 4 |
| 14, 4 | 34, 3 | 54, 4 | 74, 4 | 94, 4 |
| 15, 3 | 35, 3 | 55, 3 | 75, 3 | 95, 3 |
| 16, 4 | 36, 3 | 56, 4 | 76, 4 | 96, 4 |
| 17, 4 | 37, 3 | 57, 4 | 77, 4 | 97, 4 |
| 18, 4 | 38, 3 | 58, 4 | 78, 4 | 98, 4 |
| 19, 4 | 39, 3 | 59, 3 | 79, 3 | 99, 3 |
| 20, 4 | 40, 4 | 60, 4 | 80, 4 | |

Fig.9a

| Based-on-time mode | | | | |
|---|---|---|---|---|
| 1, 0 | 21, 0 | 41, 0 | 61, 0 | 81, 0 |
| 2, 0 | 22, 0 | 42, 0 | 62, 0 | 82, 0 |
| 3, 0 | 23, 0 | 43, 0 | 63, 0 | 83, 0 |
| 4, 0 | 24, 0 | 44, 0 | 64, 0 | 84, 0 |
| 5, 1 | 25, 1 | 45, 1 | 65, 1 | 85, 1 |
| 6, 0 | 26, 0 | 46, 0 | 66, 0 | 86, 0 |
| 7, 0 | 27, 0 | 47, 0 | 67, 0 | 87, 0 |
| 8, 0 | 28, 0 | 48, 0 | 68, 0 | 88, 0 |
| 9, 0 | 29, 0 | 49, 0 | 69, 0 | 89, 0 |
| 10, 1 | 30, 1 | 50, 1 | 70, 1 | 90, 1 |
| 11, 0 | 31, 0 | 51, 0 | 71, 0 | 91, 0 |
| 12, 0 | 32, 0 | 52, 0 | 72, 0 | 92, 0 |
| 13, 0 | 33, 0 | 53, 0 | 73, 0 | 93, 0 |
| 14, 0 | 34, 0 | 54, 0 | 74, 0 | 94, 0 |
| 15, 1 | 35, 1 | 55, 1 | 75, 1 | 95, 1 |
| 16, 0 | 36, 0 | 56, 0 | 76, 0 | 96, 0 |
| 17, 0 | 37, 0 | 57, 0 | 77, 0 | 97, 0 |
| 18, 0 | 38, 0 | 58, 0 | 78, 0 | 98, 0 |
| 19, 0 | 39, 0 | 59, 0 | 79, 0 | 99, 0 |
| 20, 1 | 40, 1 | 60, 1 | 80, 1 | 1 |

Fig.9b

| Based-on-charge mode | | | Based-on-time mode | | | | | | | |
|---|---|---|---|---|---|---|---|---|---|---|
| 1. 0 | 21. 0 | 41. 0 | 1. 30 | 21. 3 | 41. 3 | 61. 4 | 81. 4 |
| 2. 0 | 22. 0 | 42. 0 | 2. 5 | 22. 4 | 42. 3 | 62. 4 | 82. 4 |
| 3. 0 | 23. 0 | 43. 0 | 3. 3 | 23. 3 | 43. 3 | 63. 3 | 83. 3 |
| 4. 0 | 24. 0 | 44. 0 | 4. 4 | 24. 4 | 44. 4 | 64. 4 | 84. 4 |
| 5. 1 | 25. 1 | 45. 1 | 5. 4 | 25. 4 | 45. 3 | 65. 4 | 85. 4 |
| 6. 0 | 26. 0 | 46. 0 | 6. 4 | 26. 4 | 46. 4 | 66. 4 | 86. 4 |
| 7. 0 | 27. 0 | 47. 0 | 7. 3 | 27. 3 | 47. 3 | 67. 3 | 87. 3 |
| 8. 0 | 28. 0 | 48. 0 | 8. 4 | 28. 4 | 48. 4 | 68. 4 | 88. 4 |
| 9. 0 | 29. 0 | 49. 0 | 9. 4 | 29. 4 | 49. 3 | 69. 4 | 89. 4 |
| 10. 1 | 30. 1 | | 10. 4 | 30. 3 | 50. 4 | 70. 4 | 90. 4 |
| 11. 0 | 31. 0 | | 11. 3 | 31. 3 | 51. 3 | 71. 3 | 91. 3 |
| 12. 0 | 32. 0 | | 12. 4 | 32. 3 | 52. 4 | 72. 4 | 92. 4 |
| 13. 0 | 33. 0 | | 13. 4 | 33. 3 | 53. 3 | 73. 4 | 93. 4 |
| 14. 0 | 34. 0 | | 14. 4 | 34. 3 | 54. 4 | 74. 4 | 94. 4 |
| 15. 1 | 35. 1 | | 15. 3 | 35. 3 | 55. 3 | 75. 3 | 95. 3 |
| 16. 0 | 36. 0 | | 16. 4 | 36. 3 | 56. 4 | 76. 4 | 96. 4 |
| 17. 0 | 37. 0 | | 17. 4 | 37. 3 | 57. 4 | 77. 4 | 97. 4 |
| 18. 0 | 38. 0 | | 18. 4 | 38. 3 | 58. 4 | 78. 4 | 98. 4 |
| 19. 0 | 39. 0 | | 19. 4 | 39. 3 | 59. 3 | 79. 3 | 99. 3 |
| 20. 1 | 40. 1 | | 20. 4 | 40. 4 | 60. 4 | 80. 4 | |

Fig. 10

METHOD OF SPIKING MIXED ACID LIQUID IN REACTOR

CROSS REFERENCE TO RELATED APPLICATIONS

This application claims the priority benefit of Taiwan application serial no. 91101327, filed Jan. 28, 2002, the full disclosure of which is incorporated herein by

BACKGROUND OF INVENTION

1. Field of the Invention

The present invention relates to a method of spiking a mixed acid liquid in a reactor. More specifically, the invention relates to a method of fine-tuning spiking a mixed acid liquid in a reactor by using a computer to control a concentration of the mixed acid liquid at a target level.

2. Description of the Related Art

In semiconductor process, a mixed acid liquid is usually used to etch or wash a wafer. The mixed acid liquid used to etch the wafer includes hydrogen fluoride (HF)/ethylene glycol (EG) and hydrogen fluoride (HF)/glycerin (GLY). The mixed acid liquid used to wash the wafer includes hydrogen peroxide ($H_2O_2$)/sulfuric acid ($H_2SO_4$) and ozone ($O_3$)/sulfuric acid ($H_2SO_4$). Such mixed acid liquid is made up of a smaller amount of highly volatile acid(s) and a larger amount of lowly volatile acid(s). The concentration of the highly volatile mixed acid liquid determines the stability of the process. In the case of etching a silicon nitride layer by using hydrogen fluoride (HF)/glycerin (GLY) in a batch type wet etching equipment, the mixed acid liquid is made up of a smaller amount of HF and a larger amount of GLY. The etching rate of silicon nitride is based on the concentration of HF. HF decreases as the process runs, because of a so-called loading effect. Meanwhile, HF is evaporated in a thermally processing tank, or is removed from the tank by exhausting. Therefore, in order to prevent HF from being decreased and thus prevent the etching rate of silicon nitride from being reduced, HF has to be supplemented to the tank to keep the process as stable as possible.

Here, "loading effect" means that active species decrease as the number of etching or washing batch increases. Therefore, in order to maintain the concentrations of the active species, the active species have to be supplemented timely, for example, after each run or every certain run.

The supplement of the active species after each run or every certain run is illustrated in FIG. 1a and FIG. 1b. HF is the active specie in the case of FIG. 1a and FIG. 1b, with HF spike timing set at four spiking strokes for each run (before or after running), and HF spike timing set at three spiking strokes every five runs respectively. 5 c.c. HF is added for each spiking stroke.

"Thermal effect" means that the active species in a reactor is evaporated by heating or removed by exhausting, thereby the concentration of the active species decreases as time elapses. Under the thermal effect, the concentration of the mixed acid liquid containing volatile components cannot be effectively controlled. Therefore, the active species has to be timely supplemented.

In order to overcome the above problems caused by the loading effect and the thermal effect, an air valve is provided under a measuring tank for spiking as shown in FIG. 2a, or a measuring pump is used for spiking as shown in FIG. 2b. In FIG. 2a, the air valve 204 is opened for several seconds after the process has proceeded for a predetermined period, to introduce HF into a HF/GLY reactor 206, so as to increase the concentration of HF. However, this method has some drawbacks. For example, there is time delay in opening/closing the air valve 204 to introduce HF. The introduced amount of HF cannot be fine tuned, resulting in undesirably high HF concentration when HF is initially added. Undesirably high HF concentration causes a sharp increase in the etching rate.

Another approach to solve the above problems is to open the air valve 204 for several seconds after or before one or more runs to supplement HF. However, as discussed above, the introduced amount of HF cannot be fine tuned, resulting in undesirably high HF concentration when HF is initially added. Therefore, the disadvantages of the prior art cannot be overcome.

In FIG. 2b, HF is introduced by using a measuring pump 208. The measuring pump 208 controls concentration more precisely than the air valve 204. However, the concentration of HF can be not kept substantially constant after several runs. Instead, the concentration of HF is increasingly higher or lower and thus makes the etching rate unstable.

In FIG. 3a, the measuring pump is set at four spiking strokes per hour, while the spike timing is not more than four spiking strokes per hour. The excess supplement increases the HF concentration in the reactor and then increases the etching rate. In FIG. 4a, the x-axis represents the lots of product, and the y-axis represents the etching rate. When the etching rate increases over a high specification limit, the products are not subject to a subsequent process and this is considered as a defect.

In FIG. 3b, the supplement timing is set at three strokes per hour. However, the required HF supplement in the operation is more than three spiking strokes per hour. The insufficient supplement decreases the HF concentration in the reactor and then decreases the etching rate. In FIG. 4b, the x-axis represents the lots of product, and the y-axis represents the etching rate. When the etching rate decreases below a low specification limit, the products are not subject to a subsequent process and this is considered as a defect.

It is the disadvantage of HF supplement by using the air valve that quantitative HF supplement cannot be achieved. Even if the measuring pump 208 controls the supplement of HF more precisely than the air valve, still the supplementary amount of HF cannot be fine tuned. The stability of etching is therefore not stable.

A monitor wafer is commonly used to test the etching amount. By using the resultant etching amount and a grouping table of FIG. 5a, an etching time and a recipe thereof are determined. This method is called a grouping run. For example, when 115 angstroms (about $10^{-8}$ cm) of etching amount of the monitor wafer is measured, the etching amount is in the range of group 1 (i.e. 110–120 angstroms) of the grouping table. When the etching amount increases to 140 angstroms, the etching time increases to 341 seconds. That is, processing recipe 11 is performed.

Another type of grouping run is to place a monitor wafer together with the products that are to be processed into the reactor. After the processing is completed, the etching rate is calculated (etching rate=etching amount/etching time). This method goes faster than the previously mentioned grouping run, because it does not need to test the monitor wafer first. A grouping table, as shown in FIG. 5b, is required for determining the etching time and the recipe program for the next lot of products.

The grouping run has been well used in a mixed acid liquid process with unstable concentration. However, the throughput of the product is significantly affected, because of the necessary step of testing the monitor wafer. Furthermore, many monitor wafers are disadvantageously wasted.

TW Patent No. 122,834, title of "Method of adjusting concentration of APM solution in a semiconductor process," discloses that the concentration of APM solution is fine tuned by detecting the concentration of the APM solution. However, GLY is a liquid with high viscosity and a mixture of HF and GLY also has high viscosity. Therefore, detecting the concentration of solution cannot effectively and precisely control the supplement of HF.

SUMMARY OF INVENTION

In one aspect of the present invention, a method of fine-tuning spiking a mixed acid liquid in a reactor by using a computer, such that a concentration of the mixed acid liquid is well controlled is provided. The concentration of the mixed acid liquid is controlled at a target level under a based-on-charge mode, a based-on-time mode, or a based-on-time-and-charge mode.

The based-on-charge mode control provides a charge list that includes a plurality of lot numbers of product and a plurality of spiking amounts of a first acid liquid corresponding to lot numbers of product. The spiking amounts of the first acid are introduced into the reactor in an order corresponding to the lot numbers of product.

The based-on-time mode control provides a timing list that includes a plurality of spike timing points and a plurality of spiking amounts of a second acid liquid corresponding to the spike timing points. The spiking amounts of the second acid liquid are introduced into the reactor at the corresponding timing points.

The based-on-time-and-charge mode control provides a charge/timing list including spiking amounts and the spike timing points. The spiking amounts of the first acid into the reactor are based on the lot numbers of product and the spike timing points.

A method of spiking a mixed acid liquid in a reactor by using a computer to control a concentration of the mixed acid liquid is further provided. In this aspect, the concentration of the mixed acid liquid is controlled at a target level under an even-spike mode. The even-spike mode control provides a timing list including interval settings and spiking amounts of a third acid. The spiking amounts of the third acid are constant. Then, the spiking amounts of the third acid are introduced into the reactor based on the interval settings.

In order to prevent the sharp increase in the concentration of the mixed acid liquid immediately after the acid liquid is introduced, no liquid spiking is performed during etching of the product.

BRIEF DESCRIPTION OF DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings, FIGS. 1a 1b are tables showing parameters of loading effect mode control in the prior art;

FIGS. 3a–3b are tables showing parameters of the measuring pump of FIG. 2;

FIGS. 5a and 5b are tables showing parameters of grouping run in the prior art;

FIG. 7 is a table showing parameters of three types of control mode according to one embodiment of the invention;

FIGS. 8a 8b are tables showing parameters of based-on-charge mode control according to one embodiment of the invention;

FIGS. 9a 9b are tables showing parameters of based-on-time mode control according to one embodiment of the invention;

FIG. 10 is a table showing parameters of based-on-time-and-charge mode according to one embodiment of the invention;

DETAILED DESCRIPTION

Figure 2A:
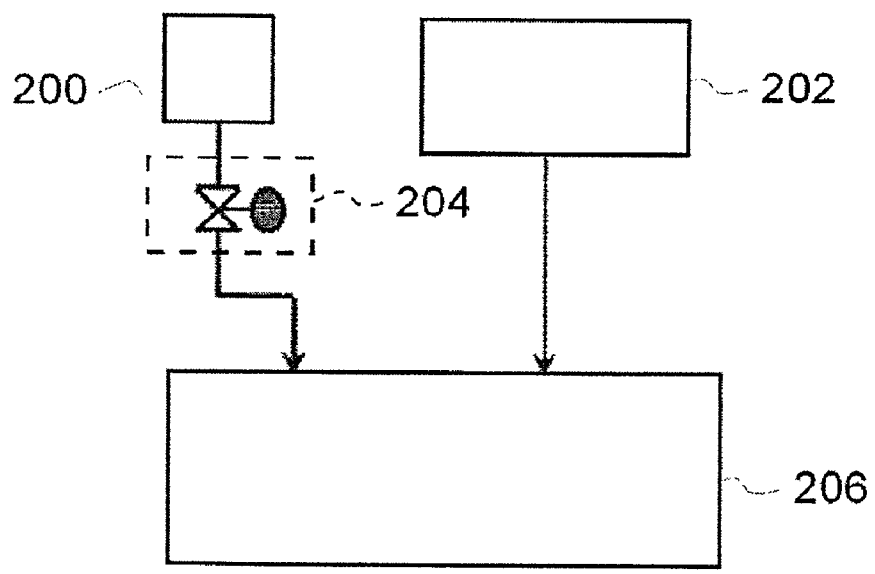
FIG. 2a is a block diagram of a conventional air valve.
Figure 2B:
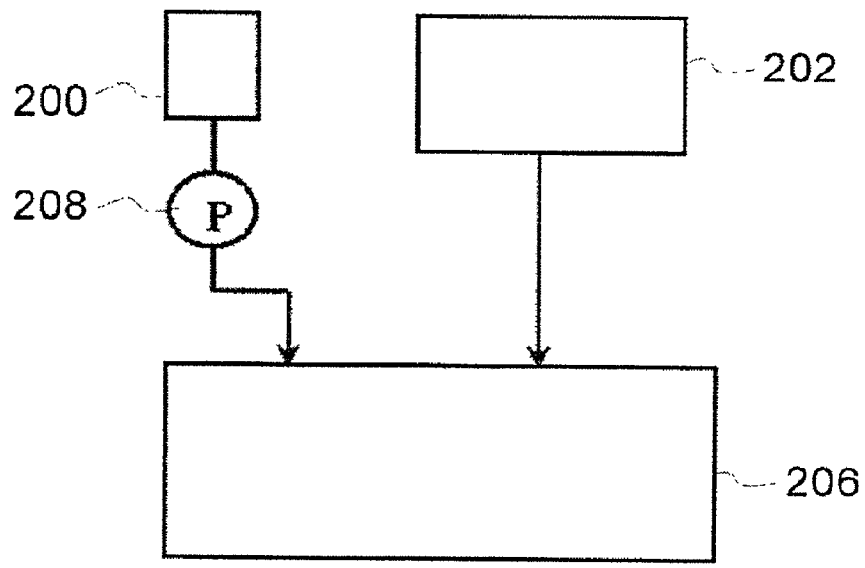
FIG. 2b is a block diagram of a conventional measuring pump.
Figure 4A:
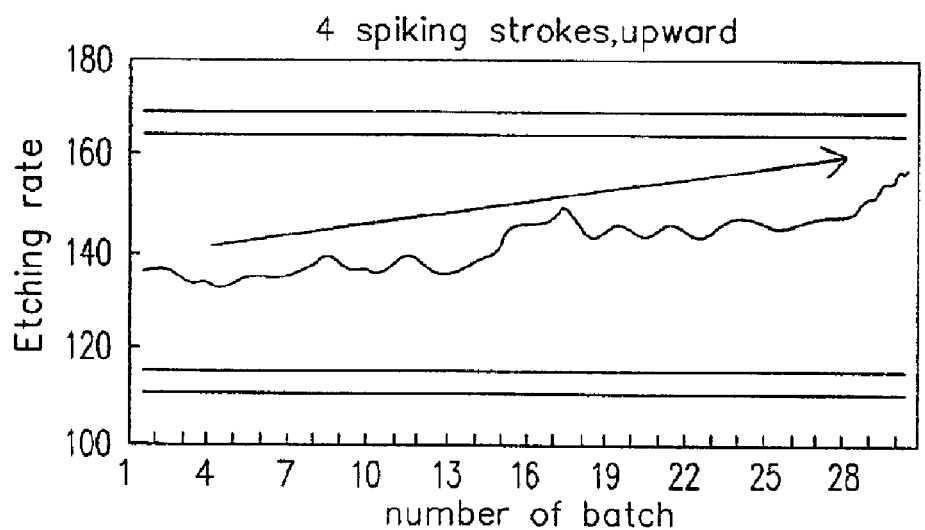
FIGS. 4a–4b are graphs showing the etching rates with correspondence to FIGS. 3a 3b.
Figure 4B:
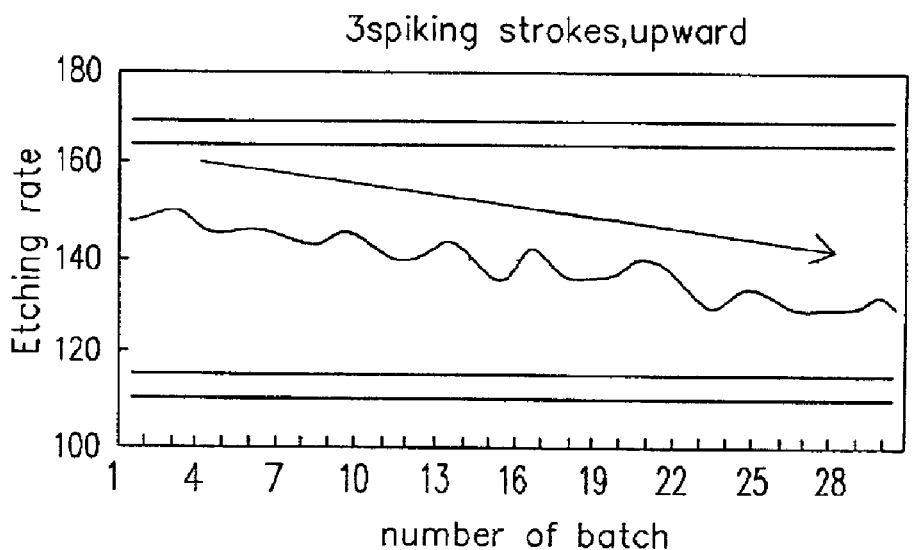

Reference will now be made in detail to the present preferred embodiments of the invention, examples of which are illustrated in the accompanying drawings. Whenever possible, the same reference numbers are used in the drawings and the description to refer to the same or like parts.

Figure 6:
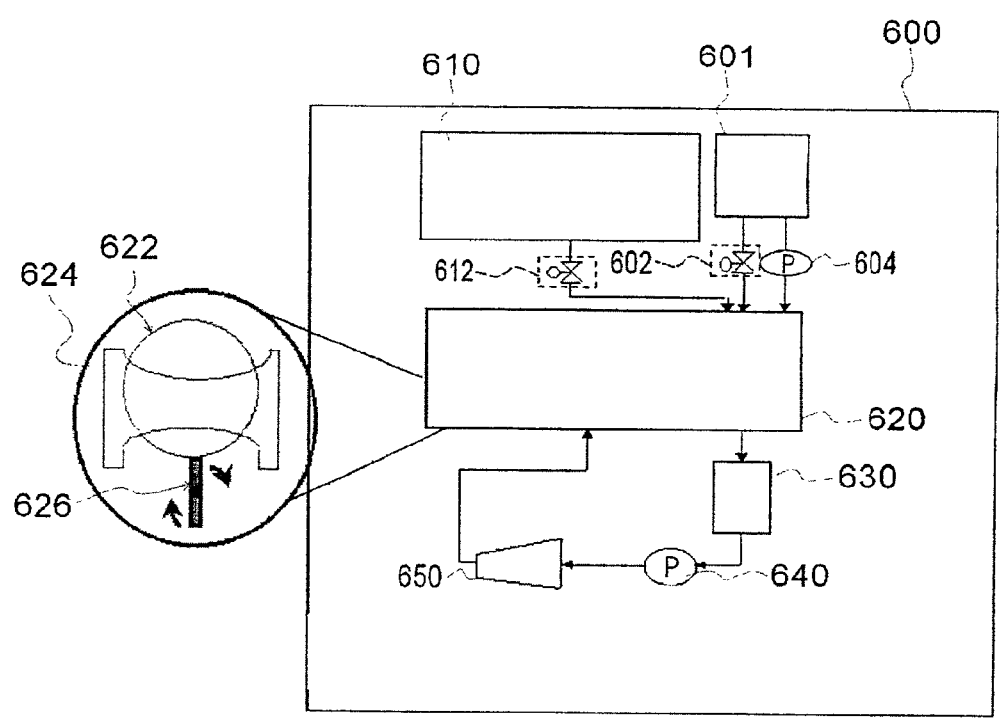
FIG. 6 is a schematic view of a wet etching equipment according to one embodiment of the invention.

FIG. 6 shows a wet etching equipment 600 according to a preferred embodiment of the present invention. The loading effect and the thermal effect are taken into consideration in design of the wet etching equipment 600. Although the invention is illustrated by exemplifying a mixed acid spike process, any other single-liquid supplement process can be also applied to the invention.

In a case that a reactor contains hydrogen fluoride (HF)/glycerin (GLY), when the used HF/GLY liquid has to be refreshed, it has to be drained from a HF/GLY reactor 620. Then, a predetermined amount of HF is introduced into the reactor 620 from a HF measuring tank 601. GLY that has been pre-heated to 60° C. in a GLY measuring tank 610 is introduced into the reactor 620. Then, the temperature of the reactor 620 is increased to 80° C. The reactor 620 is provided with a cam 626 for rotating a 622 to enhance the etching uniformity. The mixed acid liquid in the reactor 620 has high viscosity. Therefore, it is suggested to keep the cam 626 rotating even if no wafer is placed in the reactor 620. Particularly, when HF is replenished, the rotating cam 626 allows the newly added HF and a mother liquid present in the reactor 620 to mix well in a short period.

FIG. 6 and FIG. 7 show a mixed acid liquid spiking process according to a preferred embodiment of the present invention. A computer 660 controls a concentration of the mixed acid liquid in the reactor 620. The control module of the mixed acid liquid that can be used in the invention includes a based-on-charge mode, a based-on-time mode, a based-on-time-and-charge mode and an even-spike mode. The even-spike mode control is a spike control using a conventional quantitative pump spike and a quantitative timing table as shown in FIGS. 3a and 3b. The quantitative timing table includes spiking intervals and spiking amounts of the fresh acid liquid. The spiking amount of the fresh acid liquid is constant. Based on the spiking interval, a constant amount of fresh acid liquid is introduced into the reactor 620. The even-spike mode control is used after the fresh acid liquid is added to a predetermined level. The information used in the even-spike mode control can be applied to other mode controls.

The based-on-charge mode control is not like the conventional loading-effect mode control which adds the acid liquid before and after running every batch of wafers, as shown in FIG. 1a and FIG. 1b. Instead, the spike timing and spiking amount are set when a batch of wafers are placed into the reactor. At the left of FIG. 7, the numerals 1-49 indicate product lot numbers. FIG. 8a and FIG. 8b show the added amounts of the fresh acid liquid corresponding to the lot numbers. The last lot number is based on the total amount of the final product, not limited to 49.

In FIG. 8a, one spiking stroke is required for the products of lot No. 1, and two spiking strokes are required for the products of lot No. 2. On average, 1.5 spiking strokes (i.e. (1+2)/2=1.5) thus are needed to maintain the concentration of the mixed acid liquid at a desired level. FIG. 8b shows one spiking stroke is added every five lots of the products. On average, 0.2 spiking strokes ((0+0+0+0+1)/5=0.2) thus are needed. When the spiking condition is determined, the spiking amount of fresh acid liquid corresponding to the lot number is added into the reactor 620. The based-on-charge mode control is performed provided that no thermal effect occurs during processing the products.

Based-on-time mode control is not like the conventional spiking mode which constant fresh acid liquid at a constant interval. Instead, the spike timing and the spiking amount are differently set for each timing point. At the middle of FIG. 7 are listed timing points 1 99, for example, the first hour to the ninety-ninth hour from the starting point. In FIG. 9a and FIG. 9b, the right side of each timing point indicates the corresponding spiking amount of fresh acid liquid. In FIG. 9a, the timing point 3 needs three spiking strokes, the timing point 4 needs four spiking strokes, the timing point 5 needs 4 spiking strokes, and the timing point 6 needs four spiking strokes. A specific amount of fresh acid liquid is supplied at each spiking stroke. On average, 3.75 spiking strokes ((3+4+4+4)/4=3.75) are needed at each timing point from timing point 3 to timing point 6 to keep the concentration of mixed acid liquid at a desired level. FIG. 9b shows that one spiking stroke is needed every five lots of the products, that is, 0.2 spiking strokes on average ((0+0+0+ 0+1)/5=0.2) are needed. When the spiking condition is determined, the spiking amount of fresh acid liquid corresponding to the lot number is added into the reactor 620.

The based-on-time-and-charge mode control provides a list including spike timings and the corresponding spiking amounts, as shown in FIG. 10. The spiking amount of the fresh acid liquid is introduced into the reactor 620 to maintain the concentration of the mixed acid liquid at a desired level. For example, when the fifth lot of product is discharged from the reactor 620 after the fifth hour, it is the end of the fifth hour and therefore requires 4+1 spiking strokes. Since the concentration of the mixed acid liquid suddenly arises after the fresh acid liquid is introduced, no liquid spiking is performed during etching of the product. Only after the batch of products are processed and then drained out can the fresh liquid be added into the reactor 620.

Figure 11:
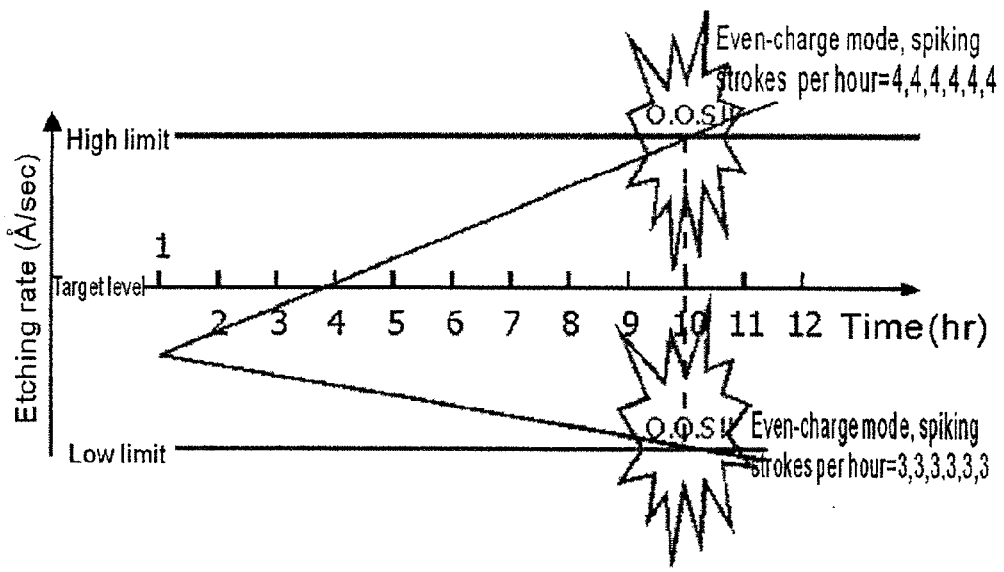
FIG. 11 is a graph showing etching rates under even-charge mode control according to one embodiment of the invention.

FIG. 11 to FIG. 14 show the improvement made by the method of the invention. FIG. 11 shows the improvement made by even-spike mode control. When HF is added at four spiking stokes per hour, the etching rate of the silicon nitride gradually increases as time elapses. At the tenth hour, the etching rate of the silicon nitride is out of specification. Furthermore, when HF is replenished at three spiking stokes per hour, the etching rate of the silicon nitride gradually decreases as time elapses. At the tenth hour, the etching rate of the silicon nitride is also out of specification.

Figure 12:
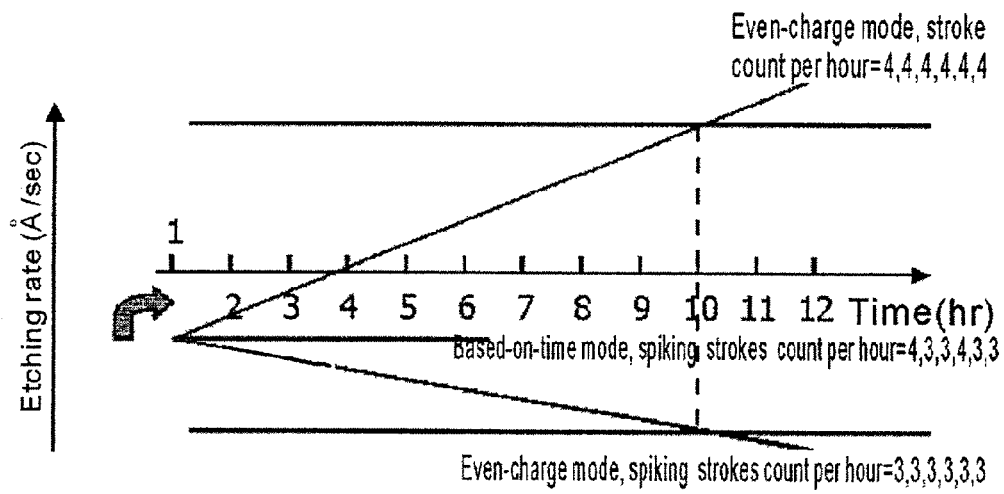
FIG. 12 is a graph showing etching rates under based-on-time mode control according to one embodiment of the invention.
Figure 13:
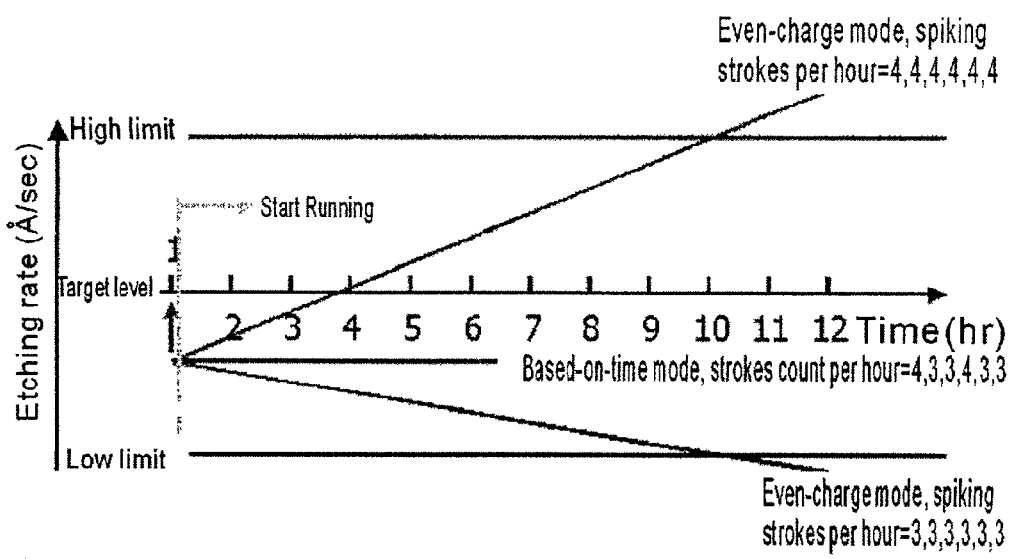
FIG. 13 is another graph showing etching rates of FIG. 12.
Figure 14:
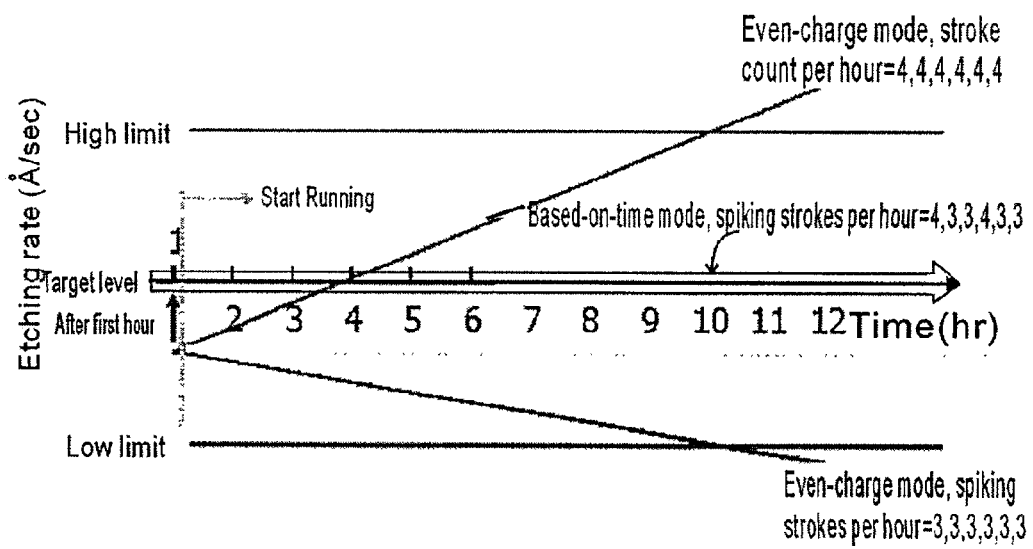
FIG. 14 is still another graph showing etching rates of FIG. 12.

In FIG. 12, in the case of based-on-time mode control, when HF is replenished with a spiking spoke cycle of 4 spiking stokes at the first hour, 3 spiking strokes at the second hour and 3 spiking strokes at the third hour, a substantially constant etching rate less than a target level is obtained. As shown in FIG. 13, a line representing the etching rate can be shifted toward the target level by adjusting the number of HF spiking strokes at the first hour and refreshing the reactor 620 after the first hour. Via HF spiking adjustment, the line of etching rate is made close to the target level as shown in FIG. 14. The spike timing after the first hour is shown in FIG. 9a. The number of spiking strokes at the first hour is adjusted to 30, and after the second hour is adjusted to 5. Then, the number of spiking strokes is repeated in the sequence of 3, 4, 4, 4. Thereby, the etching rate of the silicon nitride is adjusted close to the target level.

In view of the foregoing, the invention can be used in any condition and provide several advantages over the prior art such as quantitative supplement, fine-tuning spiking, and without over consuming the monitor wafer.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A method of spiking a mixed acid liquid in a reactor by using a computer to control a concentration of the mixed acid liquid, the concentration of the mixed acid liquid being controlled at a target level under a based-on-charge mode, a based-on-time mode, or a based-on-time-and-charge mode, the based-on-charge mode control comprising:

providing a charge list including a plurality of lot numbers of product and a plurality of spiking amounts of a first acid liquid corresponding lot numbers of product; and introducing the spiking amounts of the first acid into the reactor in an order corresponding to the lot numbers of product; the based-on-time mode control comprising:

providing a timing list including a plurality of timing points and a plurality of spiking amounts of a second acid liquid corresponding to the timing points; and introducing the spiking amounts of the second acid liquid into the reactor at the corresponding timing points;

and the based-on-time-and-charge mode control comprising:

providing a charge/timing list including spiking amounts and spike timing points; and introducing the spiking amounts of the first acid into the reactor based on the lot numbers of product and the spike timing points.

2. The method of claim 1, wherein when a wafer is being etched in the reactor, the acid liquid is not introduced into the reactor.

3. A method of spiking a mixed acid liquid in a reactor by using a computer to control a concentration of the mixed acid liquid, the concentration of the mixed acid liquid being controlled at a target level under a based-on-time-and-charge mode, wherein the based-on-time and-charge mode control comprises:

provding a charge/timing list including spiking amounts and spike timing points; and introducing the spiking amounts of the first acid into the reactor based on lot numbers of product and the spike timing points.

4. The method of claim 3, wherein when a wafer is being etched in the reactor, the acid liquid is not introduced into the reactor.

* * * * *